(12) United States Patent
Amponsah et al.

(10) Patent No.: US 12,085,589 B2
(45) Date of Patent: Sep. 10, 2024

(54) FINE PITCH PROBE CARD

(71) Applicant: Xallent Inc., Albany, NY (US)

(72) Inventors: Kwame Amponsah, Albany, NY (US); Mehmet Ozdogan, Ithaca, NY (US); Sirui Tan, Ithaca, NY (US)

(73) Assignee: Xallent Inc., Albany, NY (US)

( * ) Notice: Subject to any disclaimer, the term of this patent is extended or adjusted under 35 U.S.C. 154(b) by 239 days.

(21) Appl. No.: 17/596,644

(22) PCT Filed: Jun. 16, 2020

(86) PCT No.: PCT/US2020/037918
§ 371 (c)(1),
(2) Date: Dec. 15, 2021

(87) PCT Pub. No.: WO2020/257190
PCT Pub. Date: Dec. 24, 2020

(65) Prior Publication Data
US 2022/0341968 A1   Oct. 27, 2022

Related U.S. Application Data

(60) Provisional application No. 62/862,163, filed on Jun. 17, 2019.

(51) Int. Cl.
*G01R 1/073*     (2006.01)
*G01R 3/00*      (2006.01)
*G01R 31/28*     (2006.01)

(52) U.S. Cl.
CPC ........... *G01R 1/07342* (2013.01); *G01R 3/00* (2013.01); *G01R 31/2886* (2013.01);
(Continued)

(58) Field of Classification Search
CPC .................. G01R 1/07342; G01R 3/00; G01R 1/06744; G01R 31/2886; G01R 1/07307;
(Continued)

(56) References Cited

U.S. PATENT DOCUMENTS

2003/0062915 A1*  4/2003  Arnold .............. G01R 1/06744
                                                   324/756.03
2003/0099097 A1*  5/2003  Mok .................. G01R 1/07342
                                                          361/767
(Continued)

FOREIGN PATENT DOCUMENTS

DE          4301420 A1    6/1993
WO      2009084768 A1    7/2009

OTHER PUBLICATIONS

International Preliminary Report on Patentability, International Patent Application No. PCT/US2020/037918, dated Dec. 21, 2021, pp. 1-8.
(Continued)

*Primary Examiner* — Raul J Rios Russo
(74) *Attorney, Agent, or Firm* — Bond, Schoeneck & King, PLLC

(57) ABSTRACT

A probe chip consisting of multiple probes integrated on a single substrate. The layout of the probes could be designed to match specific features on the device under test. The probes are spring-loaded to allow for reversible deformation during contacting of the device under test. The probe chip provides for detailed electrical and mechanical testing of integrated circuits (IC).

11 Claims, 9 Drawing Sheets

(52) U.S. Cl.
CPC ...... *G01R 31/2887* (2013.01); *H01L 2924/00* (2013.01); *H01L 2924/00014* (2013.01); *H01L 2924/0002* (2013.01)

(58) Field of Classification Search
CPC ............ G01R 31/2887; H01L 2924/00; H01L 2924/00014; H01L 2924/0002
USPC .................................................... 324/754.03
See application file for complete search history.

(56) References Cited

U.S. PATENT DOCUMENTS

| | | |
|---|---|---|
| 2005/0148214 A1 | 7/2005 | Mathieu et al. |
| 2006/0139038 A1 | 6/2006 | Lee |
| 2007/0069749 A1* | 3/2007 | Lee .......................... G01R 3/00 29/884 |
| 2008/0106280 A1* | 5/2008 | Chen .................. G01R 1/06761 324/755.05 |
| 2008/0116923 A1* | 5/2008 | Cheng ................ G01R 1/07314 324/762.01 |
| 2009/0256583 A1* | 10/2009 | Chen .................. G01R 1/06761 324/755.05 |
| 2011/0187397 A1* | 8/2011 | Chen .................. G01R 1/06755 324/755.07 |
| 2012/0062260 A1* | 3/2012 | Chen .................. G01R 1/06727 324/755.07 |

OTHER PUBLICATIONS

International Search Report and the Written Opinion of the International Searching Authority, International Patent Application No. PCT/US2020/037918, pp. 1-11, dated Sep. 29, 2020.

* cited by examiner

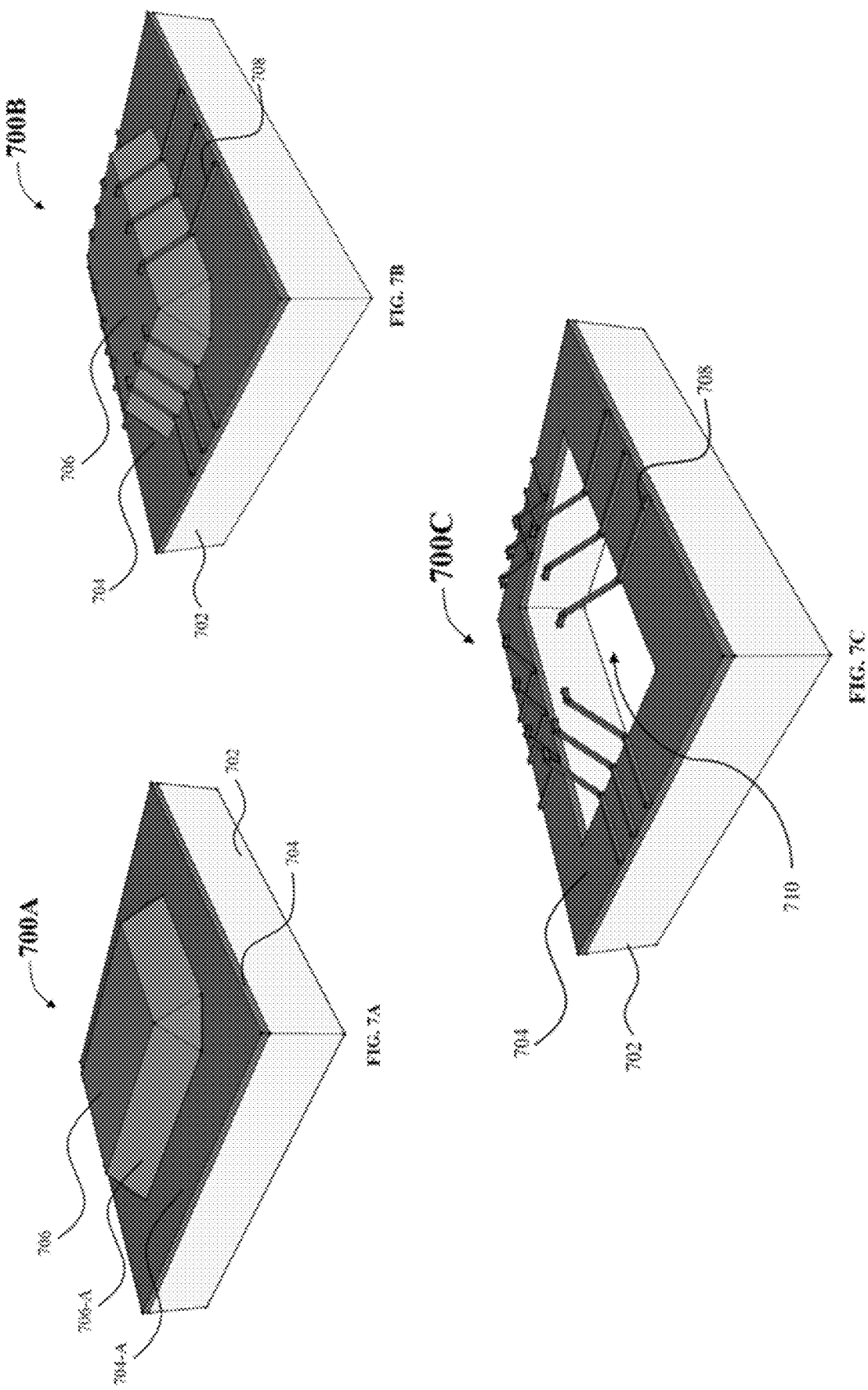

FINE PITCH PROBE CARD

CROSS REFERENCE TO RELATED APPLICATIONS

The present application is a United States National Stage Application pursuant to 35 U.S.C. § 371 of International Patent Application No. PCT/US2020/037918, filed on Jun. 16, 2020, which claims priority to U.S. Provisional Patent Application Ser. No. 62/862,163, filed on Jun. 17, 2019, which applications are hereby incorporated by reference in their entireties.

FIELD OF THE INVENTION

The present disclosure is directed generally to Probe Cards for testing semiconductor integrated circuits.

BACKGROUND

The present invention relates to a fine pitch probe card used for testing integrated circuits (IC). With the emergence of 5G technology, the number of pads and solder bumps on a wafer have increased. In addition, in order to minimize the parasitic capacitances introduced by the pads and bumps, their dimensions and spacing have decreased. The fine pitch probe card is invented to test ICs with pad or bump dimensions in the nanometer or micron scale.

SUMMARY OF THE INVENTION

The present disclosure is directed generally towards a fine pitch probe card for testing IC. The probe card consists of a fine pitch probe chip mounted on a board. The probe chip is realized by using MEMS processing techniques to build multiple probes on a single substrate.

According to an aspect is a fine pitch probe chip. The probe chip includes: a substrate; a plurality of probes made from a conductive material; a first dielectric layer; and wherein a portion of the plurality of probes are at an angle to the top surface of the substrate.

According to an embodiment, the substrate comprises silicon, silicon carbide, germanium, glass, pyrex, fused silica, ceramic, plastic, printed circuit board or quartz.

According to an embodiment, a portion of the length of each probe is at an angle of 125.3 degrees to the top surface of the substrate.

According to an embodiment, the conductive material is a cushion-like material configured to reversibly deform when pushed against a device under test.

According to an embodiment, the conductive material comprises a polymer, metal, metal-alloy, carbon nanotube, 2D material, graphene, molybdenum disulphide, and/or nanowire.

According to an aspect is a method for manufacturing a fine pitch probe chip. The method comprising the step of selectively depositing a conductive material to form the probes.

According to an embodiment, the step of selectively depositing the conductive material comprises electroplating, evaporation, sputtering, plasma enhanced chemical vapor deposition, and/or atomic layer deposition.

According to an embodiment, the step of selectively depositing a conductive material comprises 3D printing of the conductive material.

According to an embodiment, two photon polymerization is used to deposit the conductive material.

According to an aspect is a fine pitch probe chip. The probe chip includes: a substrate; a seed layer; a plurality of probes made from a conductive material; a first dielectric layer; and wherein a portion of the plurality of probes are at an angle to the top surface of the substrate.

According to an embodiment, the seed layer is a polymer.

According to an embodiment, the seed layer is cushion-like material configured to reversibly deform when pushed against a device under test.

These and other aspects of the invention will be apparent from the embodiments described below.

BRIEF DESCRIPTION OF THE DRAWINGS

The present invention will be more fully understood and appreciated by reading the following Detailed Description in conjunction with the accompanying drawings, in which:

FIG. 2D is a schematic representation of a stage of fabrication of a fine pitch probe card apparatus, in accordance with an embodiment.

FIG. 7A is the first in a series of schematic diagrams illustrating the results of progressive process stages in fabricating a fine pitch probe chip, in accordance with the embodiments.

FIG. 7B is a schematic representation of a stage of fabrication of a fine pitch probe chip apparatus, in accordance with an embodiment.

FIG. 7C is a schematic representation of a stage of fabrication of a fine pitch probe chip apparatus, in accordance with an embodiment.

DETAILED DESCRIPTION OF EMBODIMENTS

The present disclosure describes various embodiments of a fine pitch probe chip and probe card for testing semiconductor IC. The probe chip or card provides for detailed studies of electrical responses of ICs.

Fine Pitch Probe Card

Figure 1:
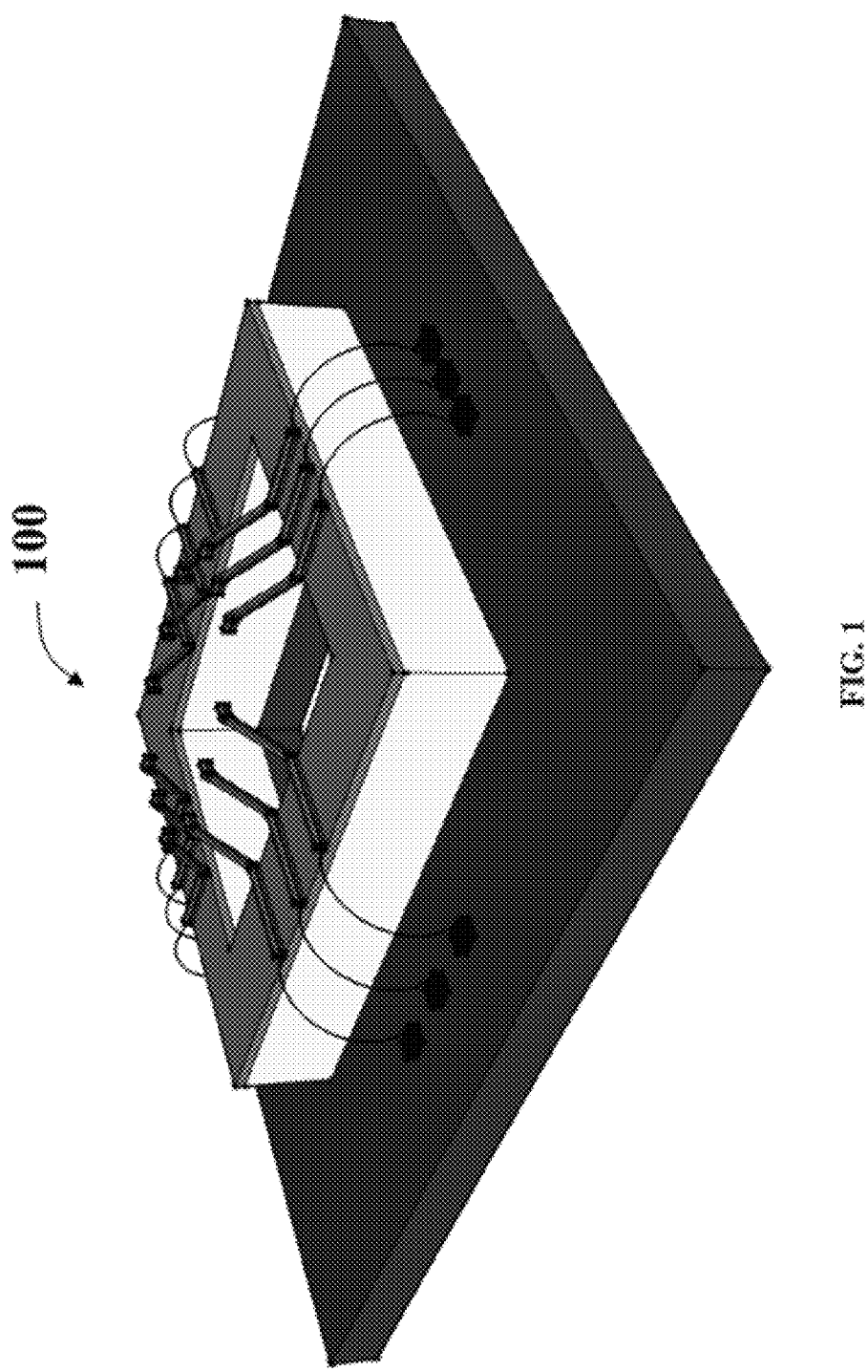
FIG. 1 is an image of a fine pitch probe card.

FIG. 1 illustrates one example of a fine pitch probe card 100 produced through the processes illustrated and described with respect to FIGS. 2A-2H below.

Referring to FIGS. 2A through 2H, in accordance with an embodiment, is a method for fabricating a fine pitch probe chip and assembly of a probe card.

Figure 2A:
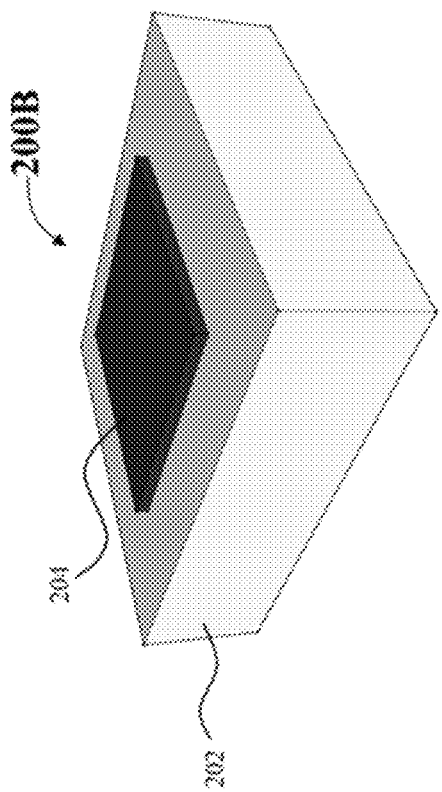
FIG. 2A is the first in a series of schematic diagrams illustrating the results of progressive process stages in fabricating a fine pitch probe card, in accordance with the embodiments.

In FIG. 2A is shown a substrate 202 which the probes are built on. The substrate comprises silicon, silicon carbide, germanium, glass, pyrex, fused silica, ceramic, plastic, printed circuit board or quartz.

Figure 2B:
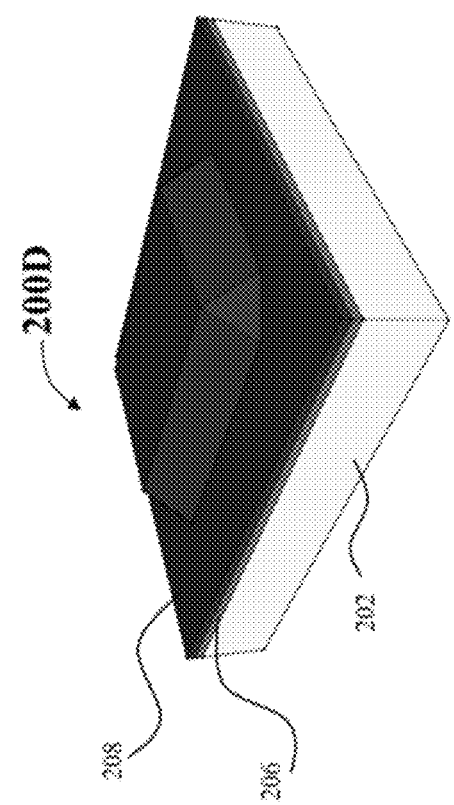
FIG. 2B is a schematic representation of a stage of fabrication of a fine pitch probe card apparatus, in accordance with an embodiment.

In FIG. 2B, an etch mask 204 is deposited on the top surface of substrate 202 and standard lithography and etching steps used to pattern the mask layer 204. The etch mask could comprise of silicon nitride, silicon dioxide, metal, polymer, photoresist or dielectric layer.

Figure 2C:
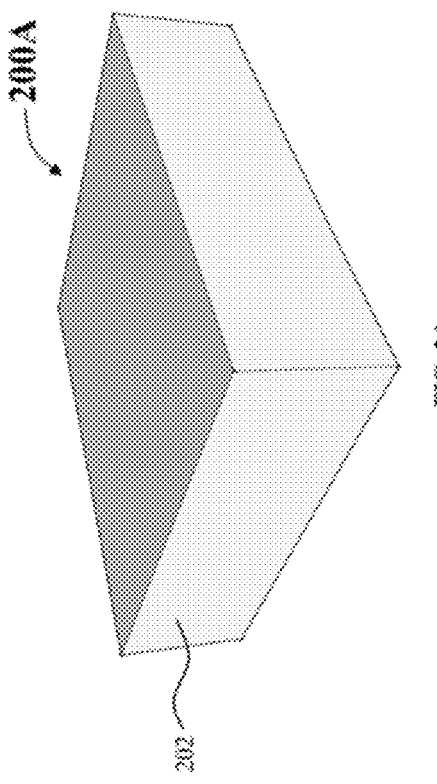
FIG. 2C is a schematic representation of a stage of fabrication of a fine pitch probe card apparatus, in accordance with an embodiment.

In FIG. 2C, using layer 204 as an etch mask, the substrate 202 is etched with either a solution or dry etched with ions. If the substrate is a <100> orientation silicon wafer, then potassium hydroxide (KOH) could be used to preferentially etch the silicon planes. The {111} plane sidewall 202-B has a 54.7 degree angle to the top surface 202-C and 125.3 degrees to the bottom surface 202-A. Depending on the substrate material and etching process, the sidewall angle between the bottom surface 202-A and the sidewall 202-B could range from 0 degrees to 180 degrees. A reactive ion etching, deep reactive ion etching or ion milling could be used to produce the sidewall profile shown in FIG. 2C. The etch mask 204 is removed after the etching process.

In FIG. 2D, a first dielectric layer 206 is first deposited on the top surface of the substrate 202. Then a conductive seed layer 208 is deposited on top of the dielectric layer 206. The dielectric layer could comprise silicon, silicon nitride or silicon dioxide. The seed layer could comprise nickel, copper, palladium, platinum, tungsten, conductive polymer or a host of metal alloys. If a conductive polymer is used as a seed layer, it could provide a cushion-like effect for the probes to reversibly deform when pushed against the device under test. The thickness of the seed layer could be tuned to provide optimal mechanical stability of the probe. The seed layer could also exhibit optical properties where light/laser beam could be directly coupled into.

Figure 2E:
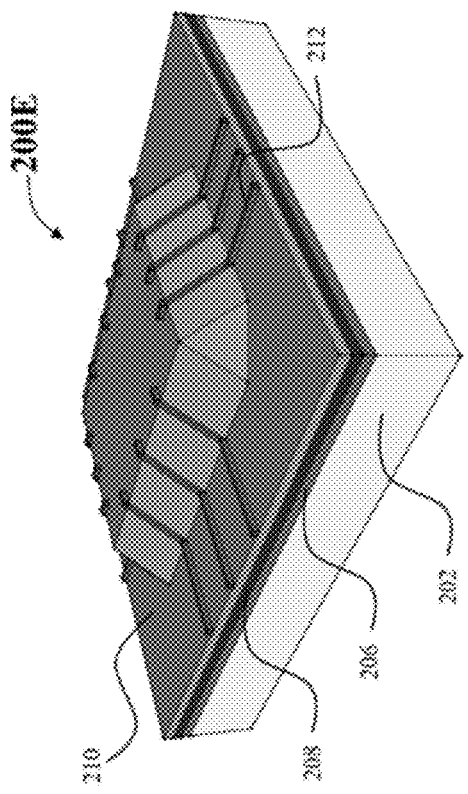
FIG. 2E is a schematic representation of a stage of fabrication of a fine pitch probe card apparatus, in accordance with an embodiment.

In FIG. 2E, photoresist 210 is spun on the seed layer 208 and standard lithography processes used to pattern the photoresist into a resist mold. A second conductive material is grown or deposited on the resist mold to form the probe electrodes 212. The conductive material could be a polymer, metal, metal-alloy, carbon nanotube, 2D material, graphene, molybdenum disulphide, and/or nanowire. The conductive material could be cushion-like, it could reversibly extend or contract upon an application of an external force to it. The step of selectively depositing a the second conductive material comprises electroplating, evaporation, sputtering, plasma enhanced chemical vapor deposition, atomic layer deposition, spin coating, and/or casting onto the resist mold.

Figure 2F:
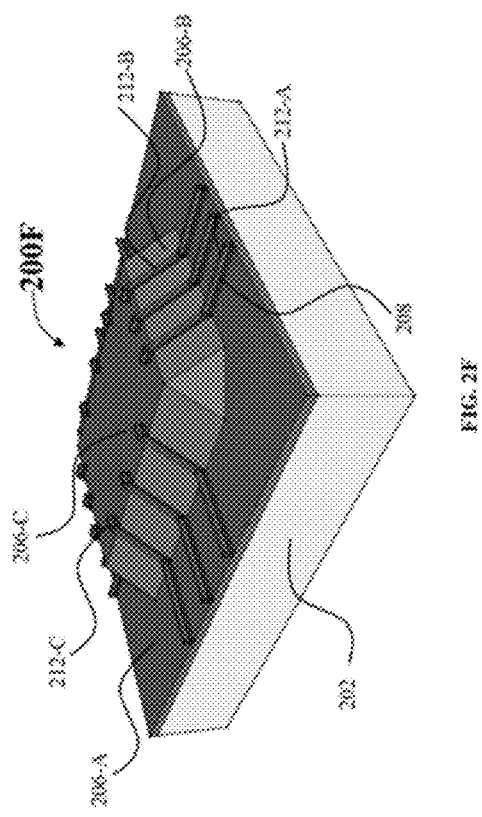
FIG. 2F is a schematic representation of a stage of fabrication of a fine pitch probe card apparatus, in accordance with an embodiment.

In FIG. 2F, the resist layer 210 is removed and the probes are formed. Each probe consists of three parts; the section 212-A that is attached to the bottom surface 206-A of the dielectric layer 206, the section 212-B attached to the sidewall 206-B of the dielectric layer 206, and section 212-C of the probe 212 that is attached to the top surface 206-C of the dielectric layer 206. The seed layer 208 is etched by reactive ion etching, ion milling or solution based etching. Right below each probe 212, there exists a seed layer 208.

Figure 2G:
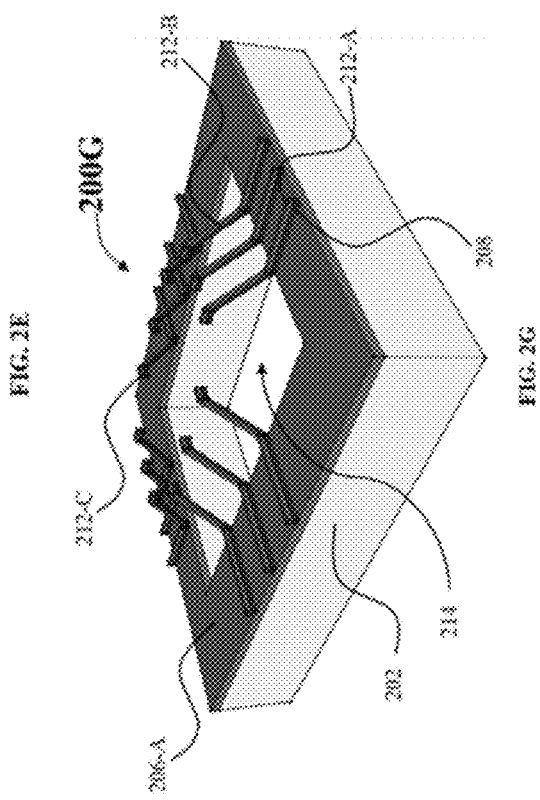
FIG. 2G is a schematic representation of a stage of fabrication of a fine pitch probe card apparatus, in accordance with an embodiment.

In FIG. 2G, a viewport 214 or window 214 is etched from the backside of the substrate 202 to its frontside. The sidewall and top surfaces of 202-B, 202-C, 206-B and 206-C are removed during the backside etch. Sections 212-B and 212-C of the probe 212 is freely suspended. The viewport could be created wider so that a portion of section 212-A is also suspended.

Figure 2H:
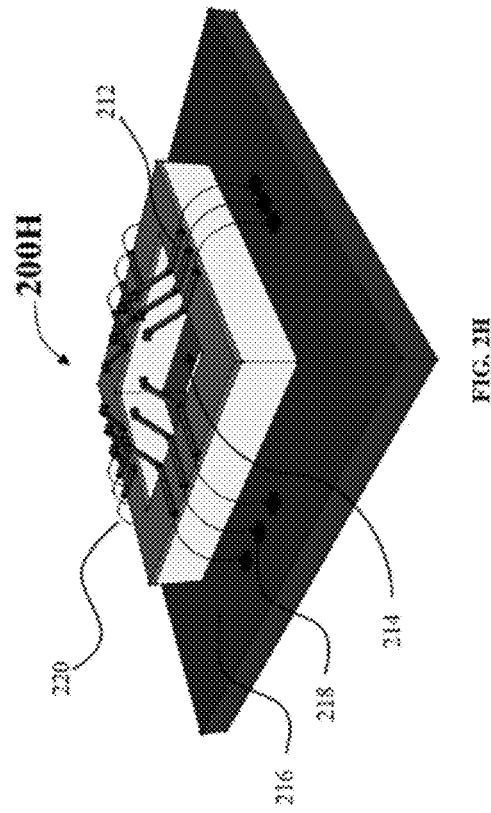
FIG. 2H is a schematic representation of a stage of fabrication of a fine pitch probe card apparatus, in accordance with an embodiment.

In FIG. 2H, the fine pitch probe chip is wirebonded to a printed circuit board 216 or ceramic board 216. A bonding wire 220 connects the probe 212 to the pad 218 on the board 216. The board 216 could also have a viewport to allow a microscope to view the sections 212-B and 212-C of the probes during wafer probing.

Figure 3:
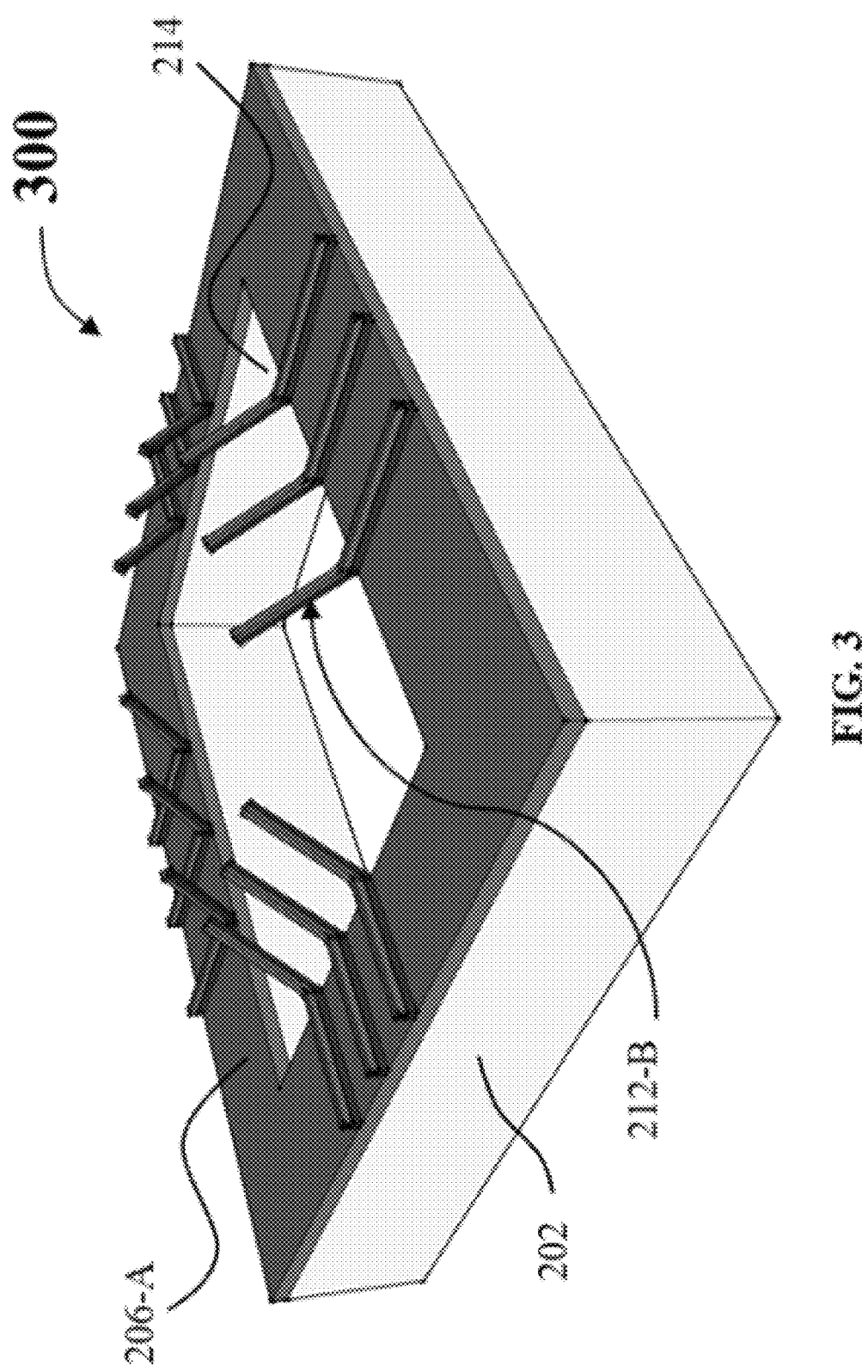
FIG. 3 is an image of a fine pitch probe chip.

Referring to FIG. 3, in accordance with an embodiment, the probe 212 does not have section 212-C.

Figure 4:
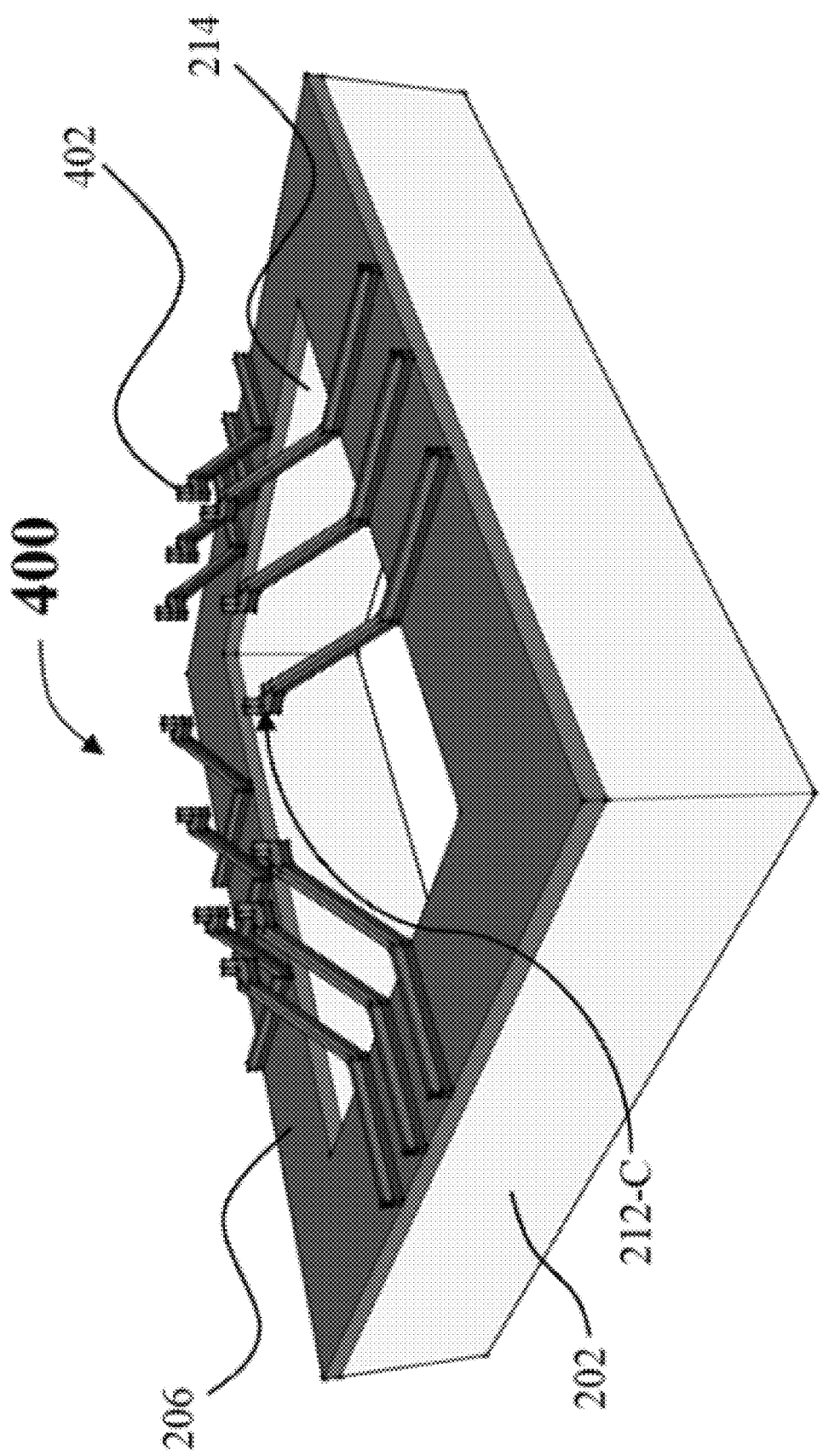
FIG. 4 is an image of a fine pitch probe chip.

Referring to FIG. 4, in accordance with an embodiment, a third conductive material 402 is deposited on top of 212-C. The conductive material 402 could comprise of a polymer, metal, carbon nanotube, 2D material or nanowire. The conductive material could be cushion-like, it could reversibly extend and contract upon an application of an external force to it. The conductive material could be electroplated, evaporated, sputtered, spin coated, or casted onto 212-C. A cavity could be etched into the conductive material 402. During solder bump testing, the bumps would insert into the cavity.

Figure 5:
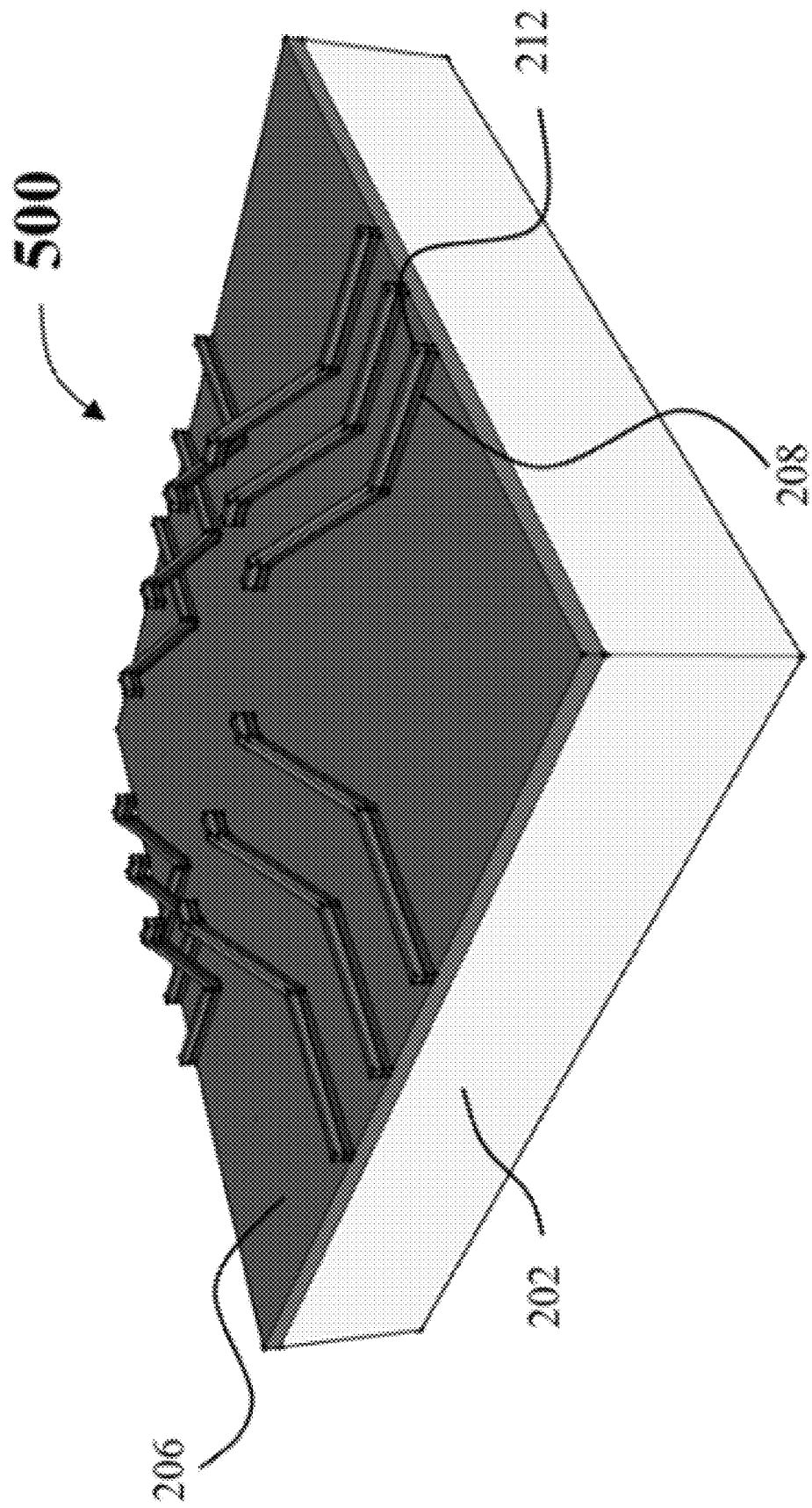
FIG. 5 is an image of a fine pitch probe chip.

Referring to FIG. 5, in accordance with an embodiment, no viewport exists in the probe chip.

Figure 6:
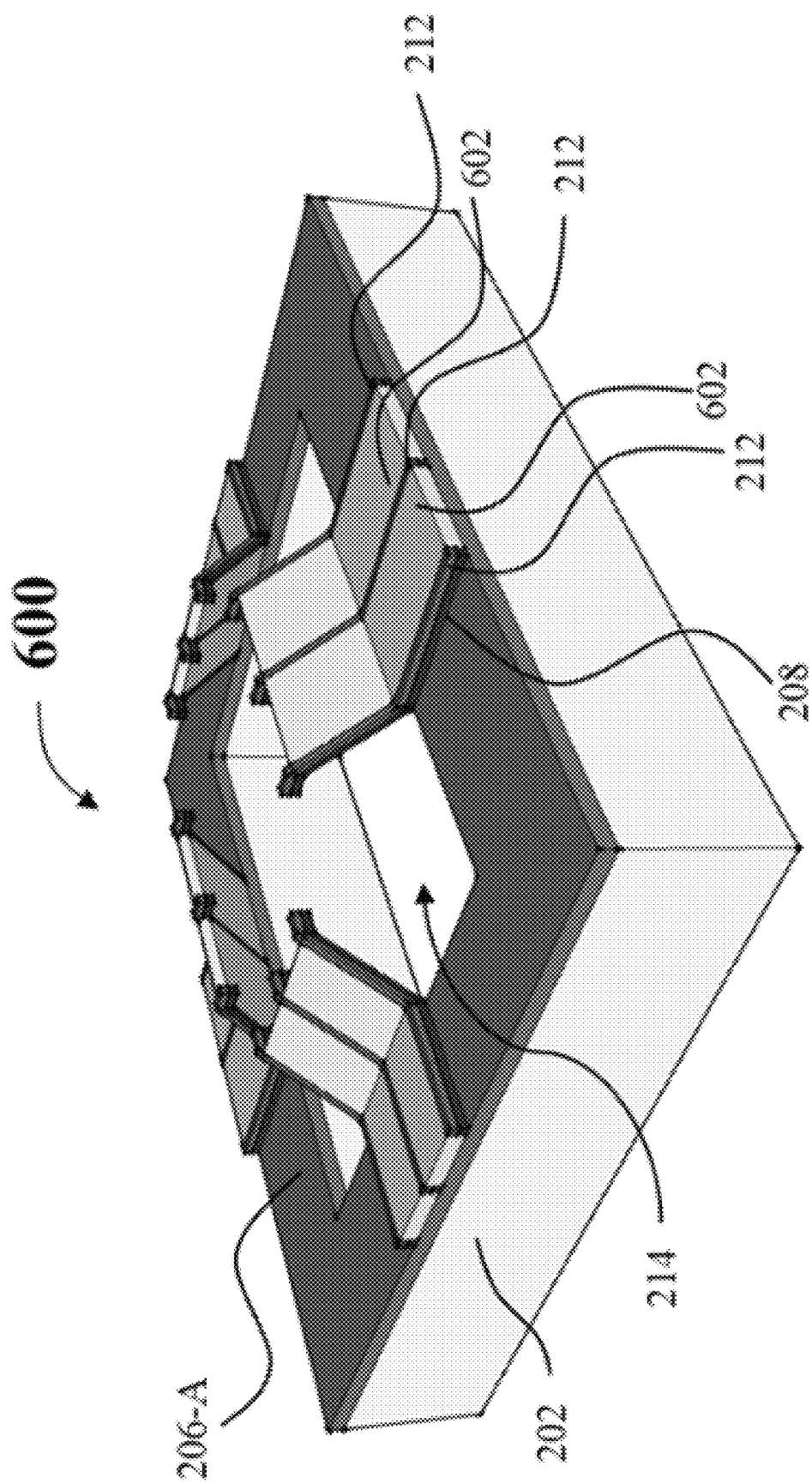
FIG. 6 is an image of a fine pitch probe chip.

Referring to FIG. 6, in accordance with an embodiment, a second dielectric layer 602 is placed between adjacent probes 212. The dielectric layer could comprise of silicon, silicon dioxide, silicon nitride, hafnium dioxide, aluminum dioxide, etc. The purpose of the dielectric layer is to provide mechanical stability, electrical isolation and improved signal integrity. In microwave and radio frequency applications, three dielectric shielded probes could serve as a ground-signal-ground (GSG) integrated probe device. Also, during the testing of a device, the three probes could be placed on a single pad on the device and high current passed between two probes to frit or remove stubborn native oxide that might exist on the pad. The middle probe could be fabricated to be long or higher than the side probes to allow for the middle probe to only make contact to a pad where the side probes are grounded to provide superior signal isolation to the middle probe.

Referring to FIGS. 7A through 7C, in accordance with an embodiment, is a method for fabricating a fine pitch probe chip.

In FIG. 7A is shown a substrate 702 which the probes are built on. The substrate could comprise of silicon, glass, fused silica, printed circuit board, plastic or ceramic. A first dielectric layer 704 is deposited on the top surface of the substrate 702. A structure 706 with sidewall 706-A is fabricated on the top surface 704-A of the dielectric layer 704. The angle between the sidewall 706-A and top surface 704-A ranges from 0 degrees to 180 degrees. The structure 706 is manufactured by depositing a material using 3D printing, or by patterning a photoresist using standard lithography, or by attaching a mold, or by performing shadow evaporation of a material, or by electroplating of a material or by two photon polymerization process. The structure 706 material could comprise of a polymer, metal, plastic, silicon, silicon dioxide, silicon nitride, PVA, PLA, PDMS, etc.

Referring to FIG. 7B, in accordance with an embodiment, a conductive material 708 is manufactured on the dielectric layer 704. The conductive material 708 could be electroplated using a resist mold as previously described, shadow evaporated, sputtered or directly deposited with a 3D printer. In addition, two photon polymerization techniques could be used if a conductive polymer is utilized. The 3D printer could operate in closed loop feedback to ensure that its nozzle is able to follow the contours of the structure 706. The conductive material could be a polymer, metal, carbon nanotube, 2D material or nanowire. The conductive layer could be cushion-like, it could reversibly extend or contract upon an application of an external force to it. The conductive material could be electroplated, evaporated, sputtered, spin coated, or casted. The conductive material 708 could be imprinted on a separate mold device which could then be stamped and transferred onto the structure 706.

In FIG. 7C, a viewport 710 or window 710 is etched from the backside of the substrate 702 to its frontside. The structure 706 is dissolved away and a portion of the probes 708 are suspended.

Referring to FIGS. 8A through 8D, in accordance with an embodiment, is a method for fabricating a fine pitch probe card. The methods described is similar to those in FIG. 2A-2G but the probes are built on a substrate with through-substrate vias (TSV).

Figure 8A:
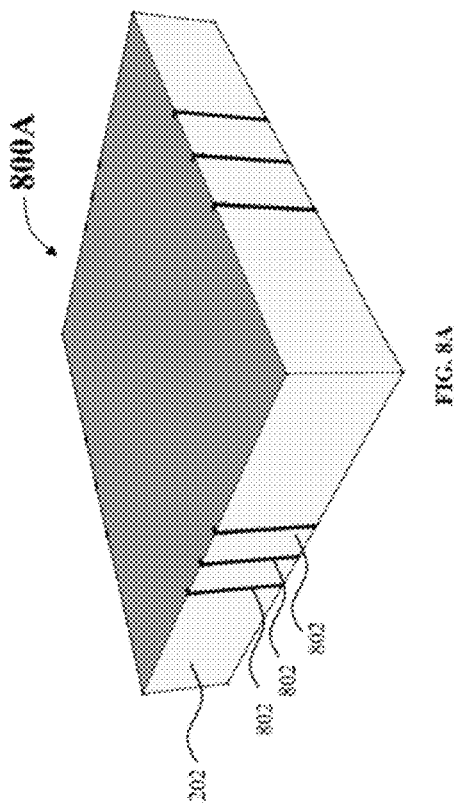
FIG. 8A is the first in a series of schematic diagrams illustrating the results of progressive process stages in fabricating a fine pitch probe card, in accordance with the embodiments.

In FIG. 8A is shown a substrate 202 which the probes are built on. The substrate has through-substrate-vias filled with a conductive material. The substrate could be silicon, glass, fused silica, printed circuit board, plastic or ceramic. And the conductive material could be metal, polymer or 2D material.

Figure 8B:
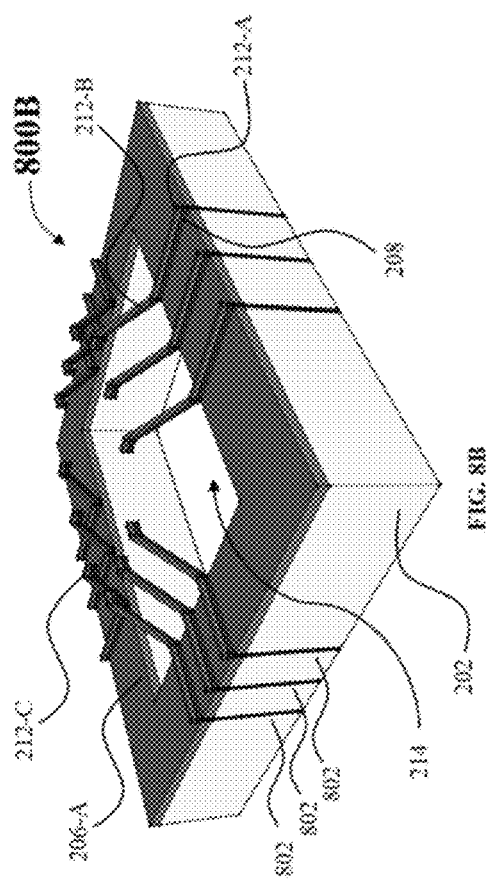
FIG. 8B is a schematic representation of a stage of fabrication of a fine pitch probe card apparatus, in accordance with an embodiment.

The manufacturing steps used in FIG. 2B-FIG. 2G are used to make the fine pitch probe chip 800B as shown in FIG. 8B.

Figure 8C:
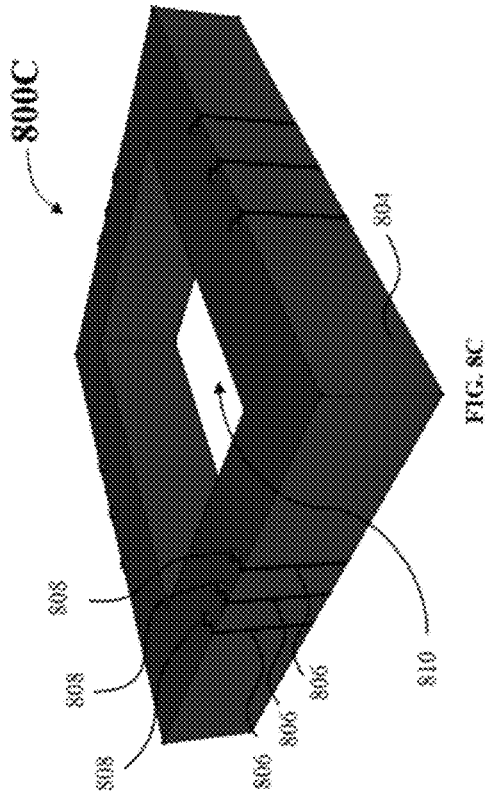
FIG. 8C is a schematic representation of a stage of fabrication of a fine pitch probe card apparatus, in accordance with an embodiment.

In FIG. 8C is shown a printed circuit board 804 or ceramic board 804 or a space transformer 804 with through-substrate-vias 806 and solder bumps 808. The board 804 also has a viewport 810 or window 810. The through-substrate-vias is filled with a conductive material. And the conductive material could be metal, polymer or 2D material. The solder bumps 808 could be made from Tin/Lead, Tin/Silver, an alloy, or 2D material.

Figure 8D:
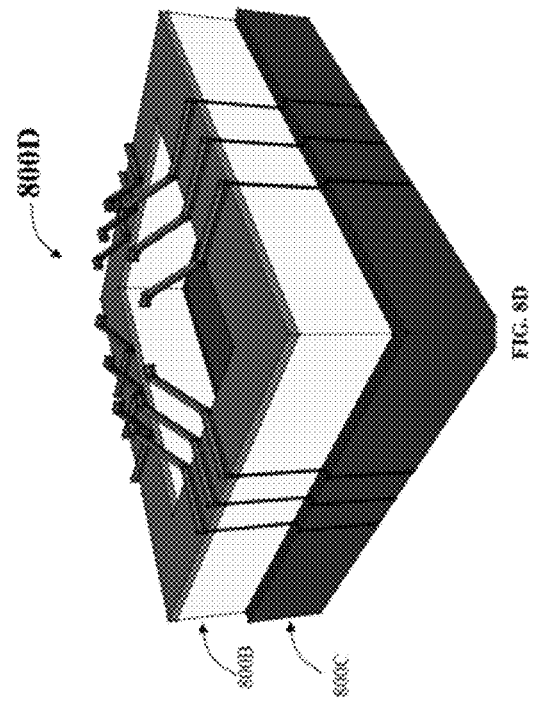
FIG. 8D is a schematic representation of a stage of fabrication of a fine pitch probe card apparatus, in accordance with an embodiment.

In FIG. 8D is shown a fine pitch probe card comprising a fine pitch probe chip 800B connected to a board 800C. To allow for high parallelism and single touchdown probing of multiple dies on a wafer, multiple probe chips could be integrated on a single board to form a probe card which is then used to test the wafer.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The above-described embodiments of the described subject matter can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single device or computer or distributed among multiple devices/computers.

What is claimed is:

1. A probe chip, the probe chip comprising:
   a substrate;
   a plurality of probes made from a conductive material;
   a first dielectric layer arranged adjacent to the substrate;
   a seed layer arranged between the plurality of probes and the first dielectric layer;
   wherein an angled portion of the plurality of probes is at an angle to the top surface of the substrate.

2. The probe chip of claim 1, wherein the substrate comprises silicon, silicon carbide, germanium, glass, pyrex, fused silica, ceramic, plastic, printed circuit board or quartz.

3. The probe chip of claim 1, wherein the angled portion of each of the plurality of probes is at an angle of 125.3 degrees to the top surface of the substrate.

4. The probe chip of claim 1, wherein the conductive material is configured to reversibly deform when pushed against a device under test.

5. The probe chip of claim 1, wherein the conductive material comprises a polymer, metal, metal-alloy, carbon nanotube, 2D material, graphene, molybdenum disulphide, and/or nanowire.

6. A method for manufacturing the probe chip of claim 1, the method comprising the step of selectively depositing the conductive material to form the plurality of probes.

7. The method of claim 6, wherein the step of selectively depositing the conductive material comprises electroplating, evaporation, sputtering, plasma enhanced chemical vapor deposition, and/or atomic layer deposition.

8. The method of claim 6, wherein the step of selectively depositing the conductive material comprises 3D printing of the conductive material.

9. The method of claim 8, wherein two photon polymerization is used to deposit the conductive material.

10. The probe chip of claim 1, wherein the seed layer is a polymer.

11. The probe chip of claim 1, wherein the seed layer is configured to reversibly deform when pushed against a device under test.

* * * * *